US009427952B2

(12) United States Patent
Larson

(10) Patent No.: US 9,427,952 B2
(45) Date of Patent: Aug. 30, 2016

(54) PREDIMENSIONED RECTANGULAR FABRIC PANEL

(71) Applicant: James D Larson, Monroe, WA (US)

(72) Inventor: James D Larson, Monroe, WA (US)

( * ) Notice: Subject to any disclaimer, the term of this patent is extended or adjusted under 35 U.S.C. 154(b) by 48 days.

(21) Appl. No.: 14/173,142

(22) Filed: Feb. 5, 2014

(65) Prior Publication Data

US 2015/0217561 A1 Aug. 6, 2015

(51) Int. Cl.
*B41F 15/36* (2006.01)
*H05K 3/12* (2006.01)
*B41F 15/34* (2006.01)

(52) U.S. Cl.
CPC ............... *B41F 15/36* (2013.01); *B41F 15/34* (2013.01); *H05K 3/1225* (2013.01)

(58) Field of Classification Search
None
See application file for complete search history.

(56) References Cited

U.S. PATENT DOCUMENTS

| | | | | | |
|---|---|---|---|---|---|
| 3,805,873 | A | * | 4/1974 | Bloomfield | 160/392 |
| 4,096,308 | A | * | 6/1978 | Reed | 101/128.4 |
| 4,186,043 | A | * | 1/1980 | Zeigler, Jr. | A41D 27/245 156/202 |
| 4,251,312 | A | * | 2/1981 | Zeigler, Jr. | A41D 27/245 156/465 |
| 4,757,854 | A | * | 7/1988 | Rippberger | 160/391 |
| 5,239,765 | A | * | 8/1993 | Opdahl | 40/603 |
| 5,443,003 | A | * | 8/1995 | Larson | B41F 15/36 101/126 |
| 6,579,403 | B2 | * | 6/2003 | Tolbert | A41D 27/245 156/291 |
| 6,760,990 | B2 | * | 7/2004 | Lowndes | 40/603 |
| 8,220,387 | B2 | * | 7/2012 | Niswonger | 101/127.1 |
| 2005/0000622 | A1 | * | 1/2005 | Cano | A41B 9/001 156/93 |
| 2005/0196585 | A1 | * | 9/2005 | Yu | 156/93 |
| 2009/0145559 | A1 | * | 6/2009 | Glasl et al. | 160/273.1 |
| 2010/0263558 | A1 | * | 10/2010 | Niswonger | 101/127.1 |

* cited by examiner

*Primary Examiner* — Jill Culler
(74) *Attorney, Agent, or Firm* — Jensen & Puntigam, PS

(57) ABSTRACT

A predimensioned rectangular screen for silk screening having the edges folded back on the main body, forming pockets along each edge for receiving tensioning rods to secure the screen to the frame. The edges are secured to the main body with a bonding material which also forms a seal.

5 Claims, 5 Drawing Sheets

PREDIMENSIONED RECTANGULAR FABRIC PANEL

TECHNICAL FIELD

This invention relates to silk screening, and in particular to the screen. Pockets are formed along each edge of the screen to receive tensioning rods which are then secured to a frame. The bonding material, in addition to forming a pocket, creates a protective seal to prevent leakage of fluids and prevent tearing. The screen, which is ready to use, includes predetermined deflection, is flexible and can be rolled or folded for shipping or storage.

BACKGROUND ART

Silk screening or transferring images to fabric or other objects has a long history. Early applications utilized a screen secured to a static wooden frame. Improvements included metal frames which included means for retensioning the screen while secured to the frame to improve the quality of the image counteracting the stretch of the screen through use.

These improvements are reflected in U.S. Pat. No. 5,443,003 granted to the present inventor on Aug. 22, 1995, which taught the use of flexible strips secured to the edges of the screen which was cut to reflect the flexure of the frame under the appropriate tension, assuring the appropriate tension for maximum clarity of the image.

A further improvement is reflected in U.S. Pat. No. 7,797,864 granted to the present inventor utilizing a preformed rigid framework, including a curvature to accommodate frame flexure, to permit retensioning on a static frame.

SUMMARY OF THE INVENTION

With the above-noted prior art in mind, it is a goal of the present invention to provide a predimensioned screen for silk screening which can be rolled or folded for shipment or storage, and then when desired secured to a frame at the appropriate tension.

It is also a goal of the present invention to provide an appropriately sized and shaped screen which includes a flexible barrier which prevents leakage of fluids and prevents tearing of the screen by accidental punctures or other damage.

The inventive screen includes pockets along the peripheral edges of the screen, allowing the insertion of one or more tensioning rods to secure the screen to the frame, permitting retensioning of the screen.

Pockets formed by folding the screen back on itself and securing the edge with a bonding material form a barrier to the flow of fluids and prevent unravelling or tearing of the screen.

BEST MODE FOR CARRYING OUT THE INVENTION

Figure 1:
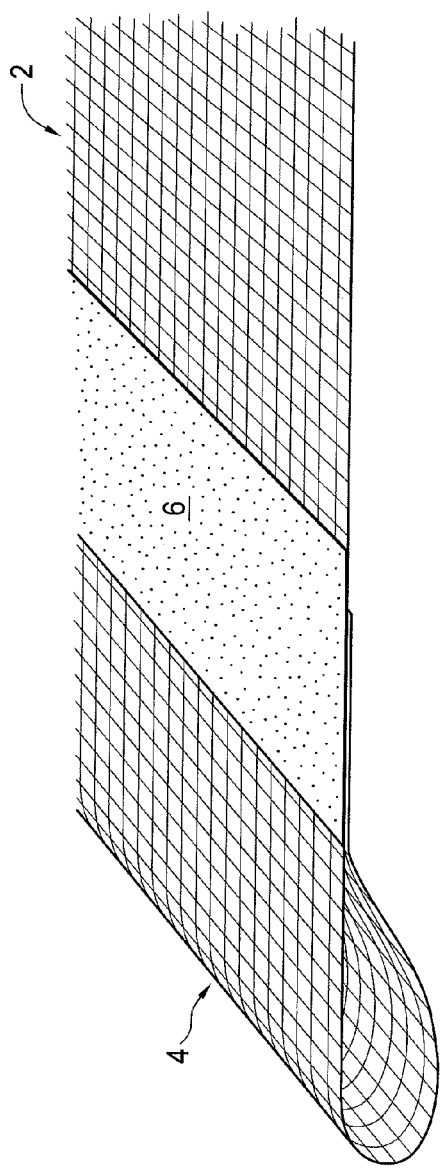
FIG. 1 is a partial view of one edge of the inventive silk screen panel.

As seen in FIG. 1, the silkscreen 2 is folded back on itself, forming a pocket 4 and then sealed as at 6. The seal 6 is shown in this figure as formed by a bonding material that penetrates both layers of fabric, forming a seal and protective coating or a seal reinforced with stitches. It is most desirable that the seal be flexible, permitting the fabric to be rolled or folded for shipping or storage. Alternate seals could include stitching or additional material.

Although not shown in this view, it is to be understood, and as illustrated later, that the silkscreen is substantially rectangular in shape, curved to allow for the flexure of the frame, and includes similar pockets along each edge.

Figure 2:
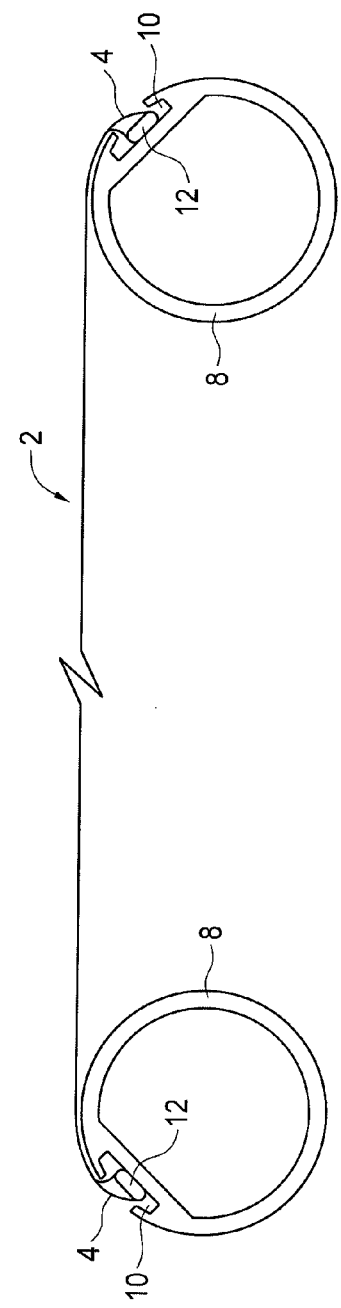
FIG. 2 is a sectional view of the inventive panel on a roller frame.

FIG. 2 illustrates the inventive screen mounted upon a roller frame including opposing rollers 8, each having a longitudinal groove 10 which captures an elongated rod within the pocket 4. As known, the rollers are rotated about their axes to the desired screen tension.

Figure 3:
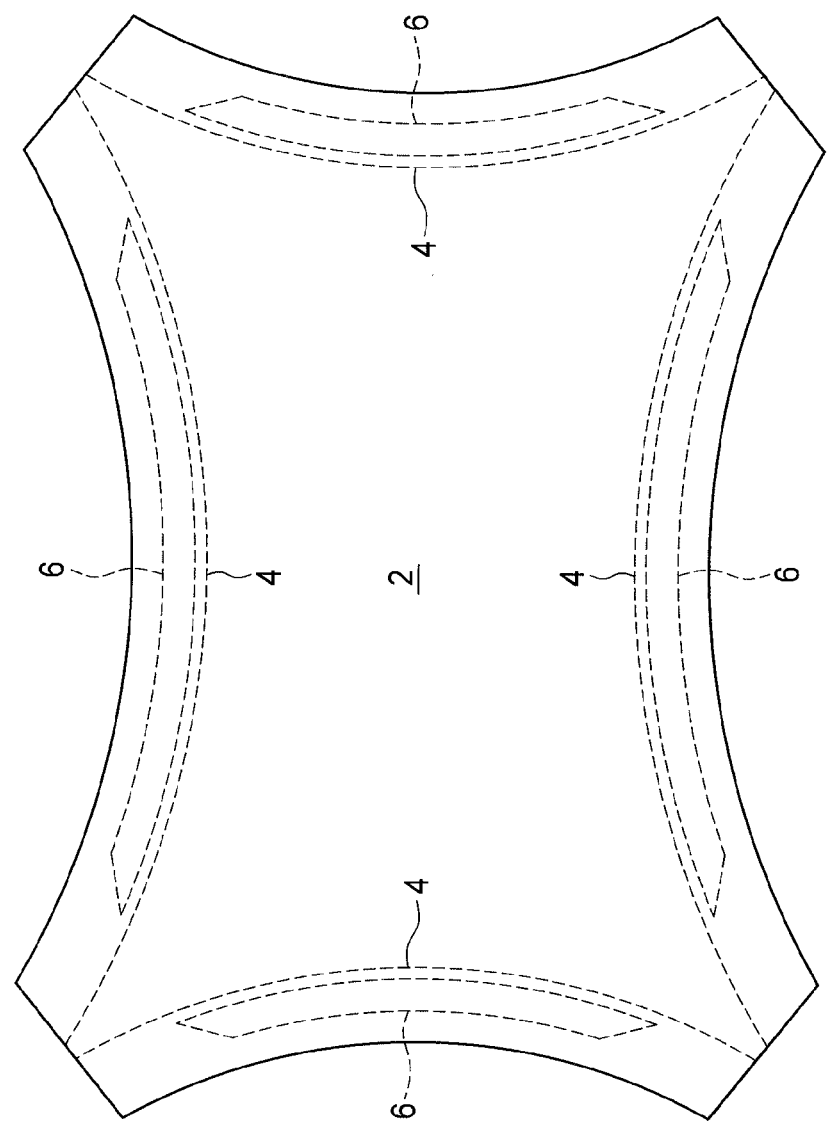
FIG. 3 is a plan view of the inventive panel.

Referring now to FIG. 3, there is illustrated a precut silkscreen 2, including peripheral pockets 4 secured with a bonding agent 6 which forms a seal and protective surface. It is to be noted that the seal does not extend the entire length of the pocket or fold 4, allowing for the softening of the corners when stretched.

Figure 4C:
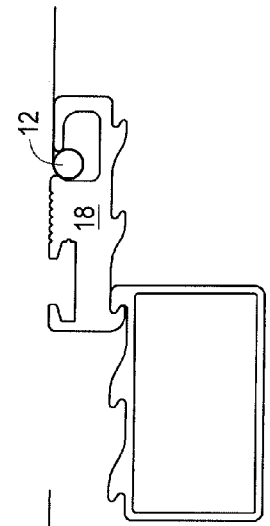
FIGS. 4A-4C illustrate another method of retensioning the inventive fabric.
Figure 4B:
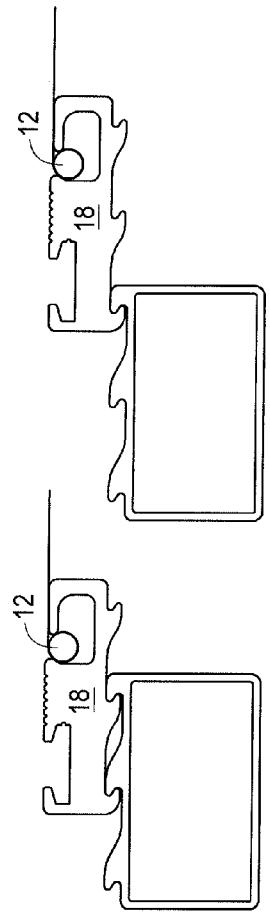
Figure 4A:
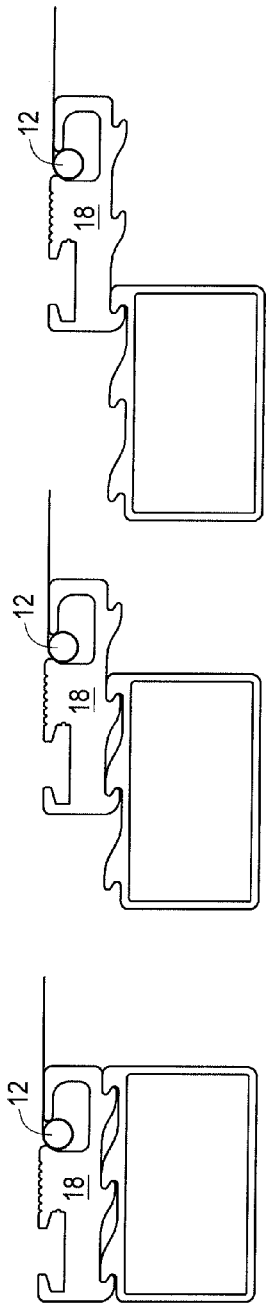
Figure 4:
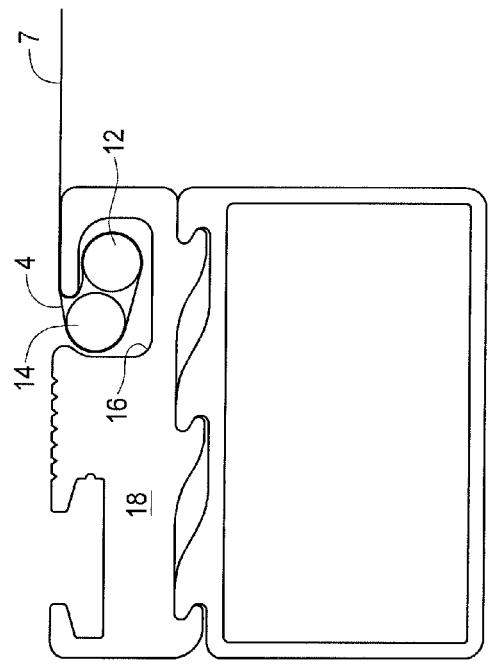
FIG. 4 is a partial sectional view of the inventive panel on a static frame depicting one method of retensioning the fabric.

FIG. 4 depicts the inventive silkscreen in use with a retensionable static frame. In this view, the pocket 4 is used to provide the retension. Normally, the screen 2 would be secured to the frame with one tensioning rod 12 but, as can be seen, a second rod 14 has been added to increase the tension. The rods 12, 14 are of a diameter such that they are trapped within the slot 16 in retensioning element 18.

FIGS. 4A-4C illustrate the retensioning utilizing one rod 12 and moving the element 18 outwardly of the frame.

Figure 5:
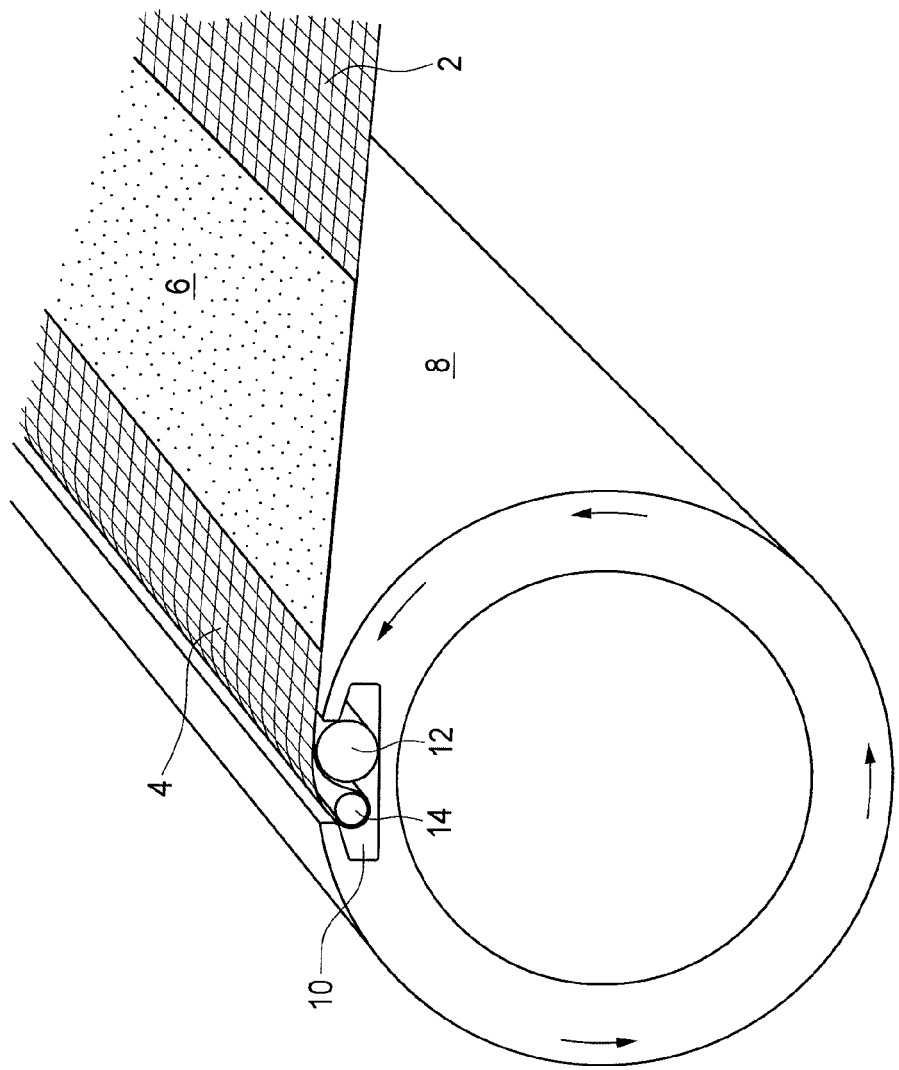
FIG. 5 illustrates the retensioned fabric on a roller frame.
Figure 6:
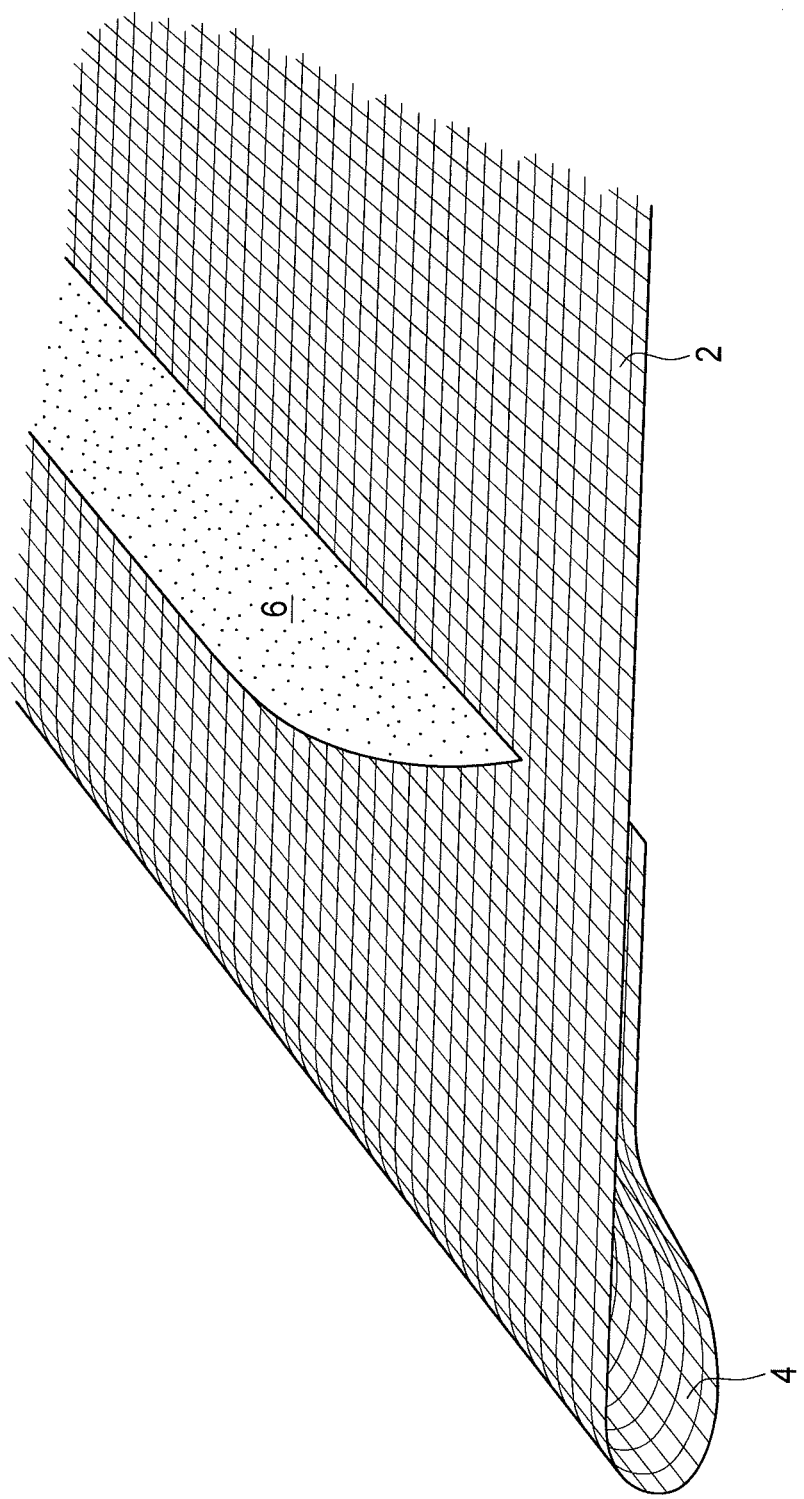
FIG. 6 illustrates the application of the bonding and sealing material forming a protective barrier and allowing for corner presoftening.

FIG. 5 illustrates the use of two rods 12, 14 to provide the extra tension with a roller frame 8. It is to be understood that a noncylindrical spline, as shown in FIG. 2, or any spline captured in the groove is acceptable As seen in FIG. 6, the silkscreen 2 is shown folded over to form a pocket and is sealed with bonding material, leaving material at the end of the bond to allow corner softening.

Although a preferred embodiment of the invention has been disclosed for purposes of illustration, it should be understood that various changes, modifications and substitutions may be incorporated in the embodiment without departing from the spirit of the invention, which is defined by the claims which follow.

What is claimed is:

1. A predimensioned rectangular mesh panel for use in silk screening, comprising:
    a center portion of silk screen mesh defining a print area; and
    a perimeter area for securing the mesh panel under tension to a frame, said perimeter area including a pocket along at least one edge of the mesh panel, formed by folding an edge portion back upon itself, and bonding the edge portion with an adhesive directly to the fabric outside the print area, without any intermediate elements, said adhesive penetrating both adjacent layers of mesh, the adhesive extending beyond the folded back edge toward the print area to form a seal, said bond incorporating the anticipated deflection, sealing the pocket from the print area, forming a barrier along the folded back edge against penetration of silk screen fluid when the mesh panel is under tension for silkscreening, and preventing damage to the mesh panel whereby the mesh panel may be rolled for shipping and a securement device inserted in the pocket for use.

2. A mesh panel of claim 1 wherein the perimeter area includes said pockets along two, three or all four edges thereof.

3. A mesh panel of claim 2, wherein the pockets are large enough to accommodate one or more securement rods for achieving higher mesh tension.

4. A mesh panel of claim 1, wherein the pocket is large enough to accommodate one or more securement rods for achieving higher mesh tension.

5. A mesh panel of claim 1, wherein the perimeter area is substantially rectangular and includes a pocket along all edges thereof, wherein the pockets curve concavely to accommodate flexure of the frame when the panel is placed under tension for silkscreening.

* * * * *